(12) United States Patent
Wu

(10) Patent No.: US 7,774,687 B2
(45) Date of Patent: Aug. 10, 2010

(54) METHOD AND SYSTEM FOR LDPC CODE ERASURE DECODING

(75) Inventor: Yuchun Wu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 366 days.

(21) Appl. No.: 11/858,662

(22) Filed: Sep. 20, 2007

(65) Prior Publication Data

US 2008/0086675 A1 Apr. 10, 2008

(30) Foreign Application Priority Data

Oct. 9, 2006 (CN) .......................... 2006 1 0135811

(51) Int. Cl.
*H03M 13/00* (2006.01)
(52) U.S. Cl. .................. 714/781; 714/704; 714/786
(58) Field of Classification Search ................ 714/781, 714/784, 704, 786
See application file for complete search history.

(56) References Cited

U.S. PATENT DOCUMENTS

| | | | | |
|---|---|---|---|---|
| 6,240,538 | B1 * | 5/2001 | Dent et al. ................... | 714/762 |
| 6,381,726 | B1 * | 4/2002 | Weng .......................... | 714/780 |
| 6,634,007 | B1 * | 10/2003 | Koetter et al. ................ | 714/784 |
| 7,103,825 | B2 * | 9/2006 | Yedidia et al. ................ | 714/760 |
| 7,237,173 | B2 * | 6/2007 | Morita et al. ................. | 714/755 |
| 7,516,389 | B2 * | 4/2009 | Song ........................... | 714/755 |
| 7,526,717 | B2 * | 4/2009 | Kyung et al. ................. | 714/800 |
| 7,587,657 | B2 * | 9/2009 | Haratsch ...................... | 714/780 |
| 2005/0283707 | A1 | 12/2005 | Sharon et al. | |
| 2006/0107176 | A1 | 5/2006 | Song | |
| 2006/0248435 | A1 * | 11/2006 | Haratsch ...................... | 714/784 |
| 2007/0288833 | A1 * | 12/2007 | Djurdjevic et al. .......... | 714/784 |

FOREIGN PATENT DOCUMENTS

CN 1770639 A 5/2006
KR 2006-0023225 A 3/2006

OTHER PUBLICATIONS

Hossein et al., *IEEE Transactions on Information Theory*, 50(3): 439-454 (2004).
Michael et al., *IEEE Transactions on Information Theory*, 47(2): 570-571 (2001).

* cited by examiner

*Primary Examiner*—Esaw T Abraham
(74) *Attorney, Agent, or Firm*—Leydig, Voit & Mayer, Ltd.

(57) ABSTRACT

The present invention discloses a method for LDPC code erasure decoding, including: generating a first code word through setting a value as a value in Galois field having two elements GF(2) at each of erasure locations in a code word; generating a second code word through setting the value as an inverse value of the value in GF(2) at each of the erasure locations in the code word; conducting a MLD error correcting operation for the first code word and the second code word to get a first result of hard decoding and a second result of hard decoding respectively; determining a result of erasure decoding according to the first result of hard decoding and the second result of hard decoding. Thus the present invention allows LDPC code erasure decoding aimed at the BEC, and increases the error correcting capability for BED signal transmitted data.

16 Claims, 4 Drawing Sheets

METHOD AND SYSTEM FOR LDPC CODE ERASURE DECODING

This application claims priority to Chinese Patent Application No. 200610135811.8, filed Oct. 9, 2006, which is hereby incorporated by reference.

FIELD OF THE TECHNOLOGY

The present invention relates to erasure decoding, and particularly, to a method and a system for LDPC code erasure decoding.

BACKGROUND OF THE INVENTION

The Internet, a typical network made up of the Binary Erasure Channel (BEC), plays an increasingly important role in the daily life. In order to transmit data on the Internet quickly and effectively, it is necessary to use the technique for fast and mass quantities transmission and error correcting of data on the Internet based on the BEC.

At present, in the process of data transmission in the Internet based on the BEC, the forward error correcting Low Density Parity Check (LDPC) code is widely used. The LDPC code mainly includes the StairCase code and the Triangle code, which, with the LDPC code becoming widely applicable, are two types of most typical code because they require less operation in the encoding accounts. The decrease of the workload for decoding operation mainly depends on the fact that the sub-matrix corresponding to the check bit in the check matrix thereof has a specific StairCase or Triangle structure.

However, a receiver conducts error correcting decoding mainly in the mode of hard decoding and soft decoding. In the BEC, there is only the hard value for the receiver's decoding input, and the soft decoding algorithm in common use such as Sum Product Algorithm (SPA) may not be used for hard decoding. The conventional hard decoding algorithm such as Bit Flip (BF) error correcting algorithm involves a rather heavy workload for operation and a limited capability of error correcting.

In the BEC, it is known to the receiver whether the data packet transmitted over is correct, and the data packet received by the receiver may only be determined as two states, i.e., the data packet transmitted over is correct or is erroneous. The received data may be decoded in the mode of erasure decoding according to the above characteristics of the data received by the receiver in the BEC so as to obtain a better decoding capacity and increase the capability of error correcting. However, there is no erasure decoding algorithm for the LDPC code in the prior art.

It can be seen that there is a lack of a method for erasure decoding when the receiver decodes data with data being transmitted using the BEC, and that the method of hard decoding as used in the prior art involves a rather heavy workload for operation and a limited capability of error correcting by comparison with the method for erasure decoding.

SUMMARY OF THE INVENTION

The embodiments of the present invention provide a method and a system for LDPC code erasure decoding, by which a decoding calculation may be made using erasure decoding algorithm aimed at LDPC codes in the BEC to increase the capacity of data error correcting.

A method for LDPC code erasure decoding includes:
generating a first code word through setting a value as a value in Galois field having two elements GF(2) at each of erasure locations in a received code word;
generating a second code word through setting the value as an inverse value of the value in GF(2) at each of the erasure locations in the received code word;
conducting a hard decoding operation for the first code word to get a first result of hard decoding;
conducting the hard decoding operation for the second code word to get a second result of hard decoding; and
determining a result of erasure decoding according to the first result of hard decoding and the second result of hard decoding.

A system for LDPC code erasure decoding includes:
a code word acquiring unit, for generating a first code word through setting a value as a value in Galois field having two elements GF(2) at each of erasure locations in a received code word; generating a second code word through setting the value as an inverse value of the value in GF(2) at each of the erasure locations in the received code word;
a hard decoding operation unit, for conducting a hard decoding operation for the first code word to get a first result of hard decoding; conducting the hard decoding operation for the second code word to get a second result of hard decoding; and
an operation result processing unit, for determining a result of erasure decoding according to the first result of hard decoding and the second result of hard decoding.

A system for LDPC code erasure is configured for:
generating a first code word through setting a value as a value in Galois field having two elements GF(2) at each of erasure locations in a received code word;
generating a second code word through setting the value as an inverse value of the value in GF(2) at each of the erasure locations in the received code word;
conducting a hard decoding operation for the first code word to get a first result of hard decoding;
conducting the hard decoding operation for the second code word to get a second result of hard decoding; and
determining a result of erasure decoding according to the first result of hard decoding and the second result of hard decoding.

The embodiments of the present invention also provide a machine-readable medium that provides instructions for LDPC code erasure decoding, wherein, when executed by a processor, the machine-readable medium causes the processor to perform operations includes:
generating a first code word through setting a value as a value in Galois field having two elements GF(2) at each of erasure locations in a received code word;
generating a second code word through setting the value as an inverse value of the value in GF(2) at each of the erasure locations in the received code word;
conducting a hard decoding operation for the first code word to get a first result of hard decoding;
conducting the hard decoding operation for the second code word to get a second result of hard decoding; and
determining a result of erasure decoding according to the first result of hard decoding and the second result of hard decoding.

It can be seen that the embodiments of the present invention enable the performed of erasure decoding aimed at the BEC so as to increase the capability of error correcting for BEC signal transmitted data.

In addition, the mode of Majority Logic Decoding (MLD) used in the method for erasure decoding in one embodiment of the present invention further lightens the complexity of such decoding and workload for operation, thus further increases the capacity and throughput for such decoding in the BEC.

DETAILED DESCRIPTION OF THE INVENTION

A method embodiment of the present invention includes: generating a first code word through setting a value as a value in Galois field having two elements GF(2) at each of erasure locations in a received code word; generating a second code word through setting the value as an inverse value of the value in GF(2) at each of the erasure locations in the received code word; conducting a hard decoding operation for the first code word to get a first result of hard decoding; conducting the hard decoding operation for the second code word to get a second result of hard decoding; and determining a result of erasure decoding according to the first result of hard decoding and the second result of hard decoding.

The inverse operation in one embodiment of the present invention includes: if the value of a code element is 1, the value of the code element is 0 after the inverse operation; in a similar way, if the value of a code element is 0, the value of the code element is 1 after the inverse operation.

The method, the system and the machine-readable storage medium in embodiments of the present invention may be used in any Binary Erasure Channel, BEC.

In an embodiment of the present invention, the hard decoding used in the process of erasure decoding includes such modes of hard decoding as MLD error correcting decoding or BF error correcting decoding where repeated iterations are needed. The MLD error correcting decoding is preferably used in an embodiment of the present invention due to relatively less operation workload.

Figure 1:
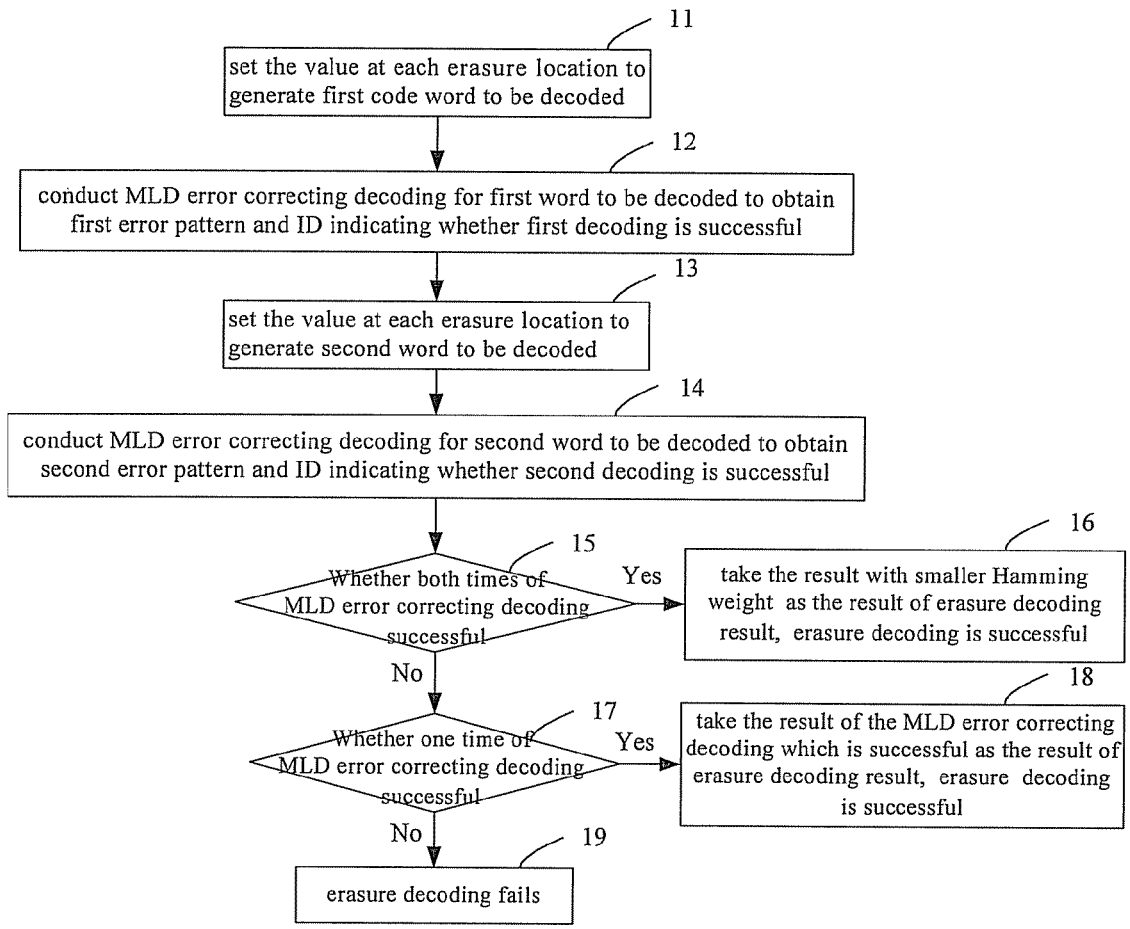
FIG. 1 is a flowchart of a method for erasure decoding in accordance with a first embodiment of the present invention.

FIG. 1 is a flowchart of a method for erasure decoding in accordance with a first embodiment of the present invention. The erasure decoding for the LDPC codes constructed based on the Euclid finite field $EG(m,2^s)$ is conducted in this embodiment, where $EG(m,2^s)$ denotes the m-dimensional space defined on $GF(2^s)$. The method for hard decoding as used in the method for erasure decoding is MLD error correcting decoding in the embodiment.

In the BEC, as assumed, it is known that the erasure locations may only involve 2t locations $(e_{i_1}, e_{i_2}, \ldots e_{i_{2t}})$ i.e., the erasure locations are $(e_{i_1}, e_{i_2}, \ldots e_{i_{2t}})$, where $$t = \left\lfloor \frac{d_{min} - 1}{2} \right\rfloor,$$

and where $d_{min}$ is the minimum code distance. As shown in FIG. 1, in this embodiment, the method for LDPC code erasure decoding includes:

Block 11: Setting a value at each of erasure locations in a code word originally received as $\cdot(f_1, f_2, \ldots f_{2t})$ $f_i \in GF(2)$, i.e., $(e_{i_1}, e_{i_2}, \ldots e_{i_{2t}}) = (f_1, f_2, \ldots f_{2t})$ $f_i \in GF(2)$, so as to generate the first code word to be decoded.

Block 12: Conducting an MLD error correcting decoding for the first code word to be decoded so as to get a first error pattern and an ID indicating whether the hard decoding operation for the first code word is successful.

Block 13: Setting a value at each of erasure locations in a code word originally received as $(\bar{f}_1, \bar{f}_2, \ldots \bar{f}_{2t})$ $f_i \in GF(2)$, i.e., $(e_{i_1}, e_{i_2}, \ldots e_{i_{2t}}) = (\bar{f}_1, \bar{f}_2, \ldots \bar{f}_{2t})$ $f_i \in GF(2)$, so as to generate the second code word to be decoded.

Block 14: Conducting an MLD error correcting decoding for the second code word to be decoded so as to get a second error pattern and an ID indicating whether the hard decoding operation for the second decoding is successful.

Block 15: Determining whether the hard decoding operations for the first and second code words are successful; if both are successful, perform step 16; otherwise, perform step 17.

Block 16: Taking the result of MLD error correcting decoding with the smaller Hamming Weight of the two error pattern as the result of the erasure decoding, and determine that the erasure decoding is successful. The procedure for erasure decoding is over.

Block 17: Determining whether one of the hard decoding operations for the first and second code words is successful; if there is one, perform step 18; otherwise, perform step 19.

Block 18: Taking the result of MLD error correcting decoding which is successful as the result of the erasure decoding, and determine that the erasure decoding is successful. The procedure for erasure decoding is over.

Block 19: Determining that the erasure decoding has failed.

A detailed description of the method for erasure decoding in an embodiment of the present invention is hereinafter given by taking the case as an example where the code length set in the BEC is 15, and it is known that the error may only appears at 4 locations $e_{i_1}, e_{i_2}, e_{i_3}, e_{i_4}$ $1 \leq i_j < 16$.

Figure 2:
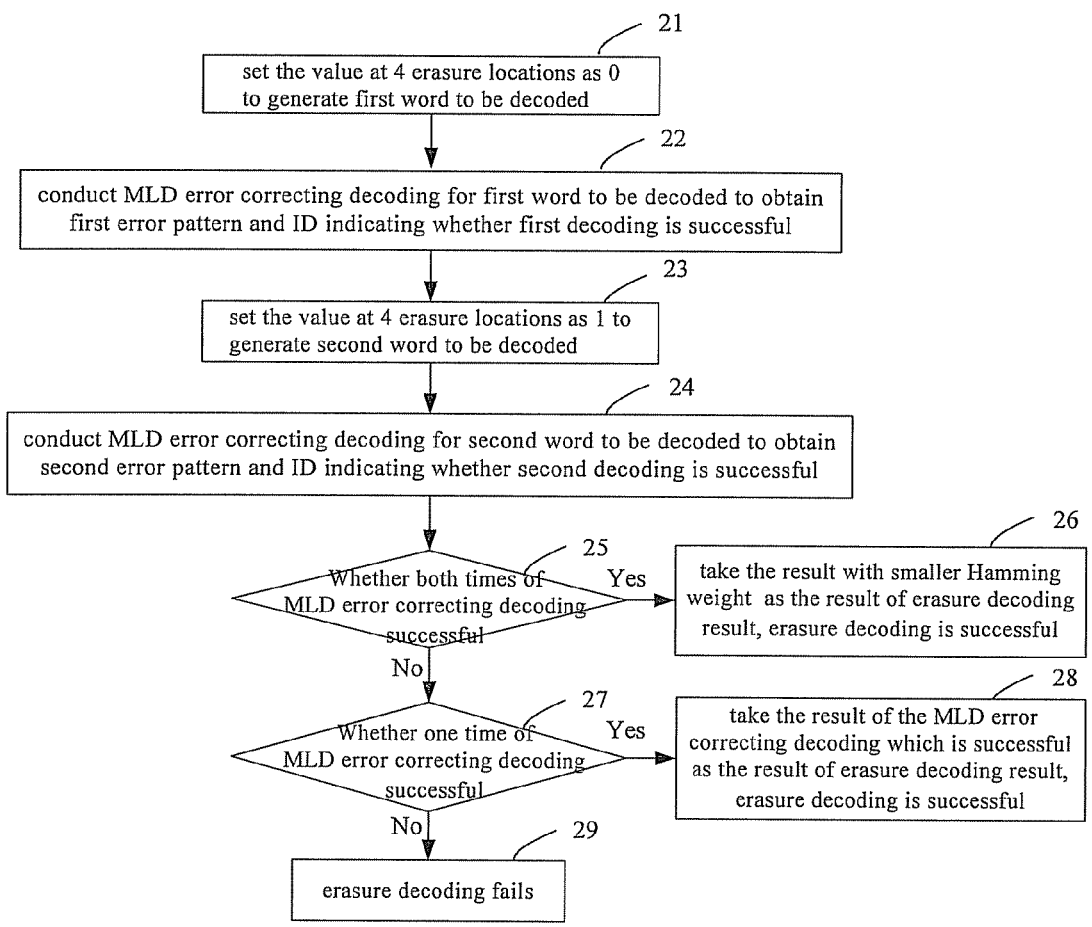
FIG. 2 is a flowchart of a method for erasure decoding in accordance with a second embodiment of the present invention.

FIG. 2 is a flowchart of a method for LDPC code erasure decoding in accordance with a second embodiment of the present invention. As shown in FIG. 2, in the embodiment, the method for LDPC code erasure decoding includes:

Block 21: Setting $(e_{i_1}, e_{i_2}, e_{i_3}, e_{i_4}) = (f_0, f_1, f_2, f_3)$ $f_i \in GF(2)$ as the first code word to be decoded. A conventional method is used in this embodiment: take $(e_{i_1}, e_{i_2}, e_{i_3}, e_{i_4}) = (0,0,0,0)$ so as to generate the first code word to be decoded.

Block 22: Conducting an MLD error correcting decoding for the first code word to be decoded so as to get a first error pattern and an ID indicating whether the hard decoding operation for the first code word is successful.

Block 23: Setting $(e_{i_1}, e_{i_2}, e_{i_3}, e_{i_4}) = (\bar{f}_0, \bar{f}_1, \bar{f}_2, \bar{f}_3)$ $f_i \in GF(2)$ as the second code word to be decoded. In this embodiment, let $(e_{i_1}, e_{i_2}, e_{i_3}, e_{i_4}) = (1,1,1,1)$ so as to generate the second code word to be decoded.

Block 24: Conducting an MLD error correcting decoding for the second code word to be decoded so as to get a second error pattern and an ID indicating whether the hard decoding operation for the second decoding is successful.

Block 25: Determining whether the hard decoding operations for the first and second code words are successful; if both are successful, perform step 26; otherwise, perform step 27.

Block 26: Taking the error pattern with a smaller Hamming Weight as an erasure error pattern, take the modulo-2 sum of the erasure error pattern and the code word originally received as the result of the erasure decoding, and thus determine that the erasure decoding is successful. The procedure for erasure decoding is over.

Block 27: Determining whether one of the hard decoding operations for the first and second code words is successful; if there is one, perform step 28; otherwise, perform step 29.

Block 28: Taking the error pattern corresponding to the successful MLD error correcting decoding as the erasure error pattern, take the modulo-2 sum of the erasure error pattern and the code word originally received as the result of the erasure decoding, and thus determine that the erasure decoding is successful. The procedure for erasure decoding is over.

Block 29: Determining that the erasure decoding has failed.

It can be seen that the method for erasure decoding provided by one embodiment of the present invention allows erasure decoding in the BEC, and increases the error correcting capability for BED signal transmitted data.

The MLD error correcting decoding is used as hard decoding in one embodiment of the present invention so that the complexity of decoding and operation workload is further lightened.

A detailed description of the method for MLD error correcting decoding in one embodiment of the present invention is hereinafter given.

Figure 3:
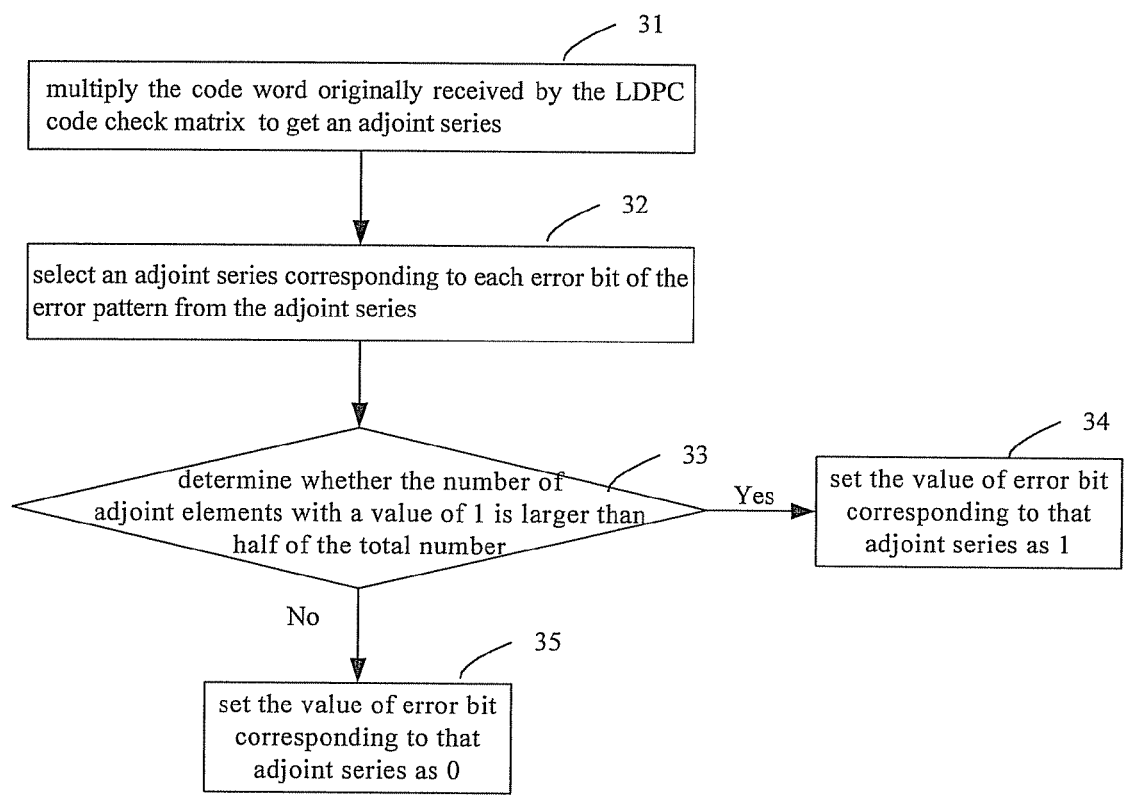
FIG. 3 is a flowchart of a method for LDPC code MLD error correcting decoding in accordance with an embodiment of the present invention.

FIG. 3 is a flowchart of a method for LDPC code erasure decoding in accordance with an embodiment of the present invention. In this embodiment, MLD error correcting decoding is the MLD error correcting decoding for the LDPC codes constructed based on the finite field $EG(m,2^s)$. The decoding procedure includes:

Block 31: Multiplying the code word originally received by the check matrix $H^T$ to get an adjoint series $s_1, s_2, \ldots s_j$.

Block 32: Selecting, from the adjoint series, an adjoint series corresponding to each error bit of the error pattern.

The adjoint series corresponding to the error bit is mode up of the elements in the adjoint series having the same location as matrix element in the check matrix which is selected in the check matrix where the value of the matrix element is 1, and the column number of the matrix element is the same as the serial number of the error bit.

From Block 33 to Block 35: Determining whether the number of adjoint elements with a value of 1 in adjoint series corresponding to the error bit is larger than half of the total number of adjoint elements; if so, set the value of the currently error bit as 1; otherwise, set the value of the currently error bit as 0.

The error correcting for any error bit $e_i$ includes selecting several $s_{i_1}, s_{i_2}, \ldots s_{i_l}$ corresponding to the error bit; if over half of the total have a value of 1, then $e_i=1$; otherwise, $e_i=0$. Further, if the error bit in the error pattern currently processed is error bit i, then the adjoint element indexes in the adjoint series corresponding to the error bit are the indexes of the lines with element i being 1 in the H.

A detailed description of the procedure for MLD error correcting decoding by taking the case of $EG(m,2^s)$ (m=2, s=2) as an example is given hereinafter.

In the case of $EG(m,2^s)$ (m=2,s=2) there are altogether $n-1=2^{ms}-1=15$ nonzero points; there are $$J = \frac{(2^{(m-1)s}-1)(2^{ms}-1)}{2^s-1} = 15$$

lines not passing the zero point; the corresponding check matrix H is:

$$H = \begin{bmatrix} 1 & 0 & 0 & 0 & 1 & 0 & 0 & 0 & 0 & 0 & 0 & 1 & 1 & 1 & 0 \\ 1 & 0 & 0 & 0 & 0 & 0 & 0 & 1 & 1 & 0 & 1 & 0 & 0 & 0 \\ 1 & 0 & 1 & 0 & 0 & 0 & 1 & 0 & 0 & 0 & 0 & 0 & 0 & 0 & 1 \\ 1 & 1 & 0 & 1 & 0 & 0 & 0 & 1 & 0 & 0 & 0 & 0 & 0 & 0 & 0 \\ 0 & 1 & 1 & 0 & 1 & 0 & 0 & 0 & 1 & 0 & 0 & 0 & 0 & 0 & 0 \\ 0 & 1 & 0 & 0 & 0 & 1 & 0 & 0 & 0 & 0 & 0 & 0 & 0 & 1 & 1 \\ 0 & 1 & 0 & 0 & 0 & 0 & 0 & 0 & 1 & 1 & 0 & 1 & 0 & 0 \\ 0 & 0 & 1 & 1 & 0 & 1 & 0 & 0 & 0 & 1 & 0 & 0 & 0 & 0 & 0 \\ 0 & 0 & 1 & 0 & 0 & 0 & 0 & 0 & 0 & 0 & 1 & 1 & 0 & 1 & 0 \\ 0 & 0 & 0 & 1 & 0 & 0 & 0 & 0 & 0 & 0 & 0 & 1 & 1 & 0 & 1 \\ 0 & 0 & 0 & 1 & 1 & 0 & 1 & 0 & 0 & 0 & 1 & 0 & 0 & 0 & 0 \\ 0 & 0 & 0 & 0 & 1 & 1 & 0 & 1 & 0 & 0 & 0 & 1 & 0 & 0 & 0 \\ 0 & 0 & 0 & 0 & 0 & 1 & 1 & 0 & 1 & 0 & 0 & 0 & 1 & 0 & 0 \\ 0 & 0 & 0 & 0 & 0 & 0 & 1 & 1 & 0 & 1 & 0 & 0 & 0 & 1 & 0 \\ 0 & 0 & 0 & 0 & 0 & 0 & 0 & 1 & 1 & 0 & 1 & 0 & 0 & 0 & 1 \end{bmatrix}$$

That LDPC codes are actually cyclic codes of $(n,k,d_{min})=(15,7,5)$ which create a polynomial $g(x)=x^8+x^7+x^6+x^4+1$.

If the code word transmitted in the BEC is $\bar{x}=(x_0, x_1 \ldots x_{14})$, the error pattern is $\bar{e}=(e_0, e_1 \ldots e_{14})$, the code word originally received is $\bar{y}=(y_0, y_1 \ldots y_{14})$.

First, conduct an error correcting for $y_0$, i.e., the error pattern $e_0$ of $y_0$ has to be calculated. Take all the line vectors with $h_{i,0}=1$ in H (there are $$\frac{(2^{ms}-1)}{2^s-1} - 1 = 4$$

such vectors altogether), i.e., the first 4 lines. Make dot products in field GF(2) for the received series $\bar{y}$ and these 4 line vectors respectively, thus obtain $s_1, s_2, s_3, s_4$. If over a half in $s_1, s_2, s_3, s_4$ have a value of 1, then $e_0=1$, otherwise, $e_0=0$.

Similarly, the operation of error correcting of error bit at other locations may be conducted, i.e., the operation of error correcting for each location of $y_1 \ldots y_{14}$ may be conducted in the same way.

It can be seen that less operations are needed for MLD error correcting decoding in one embodiment of the present invention, e.g., in the case of moderate code length parameters m=2, s=6 there are only 2 times of addition for each element 1 in H on an average using MLD decoding algorithm, so that the complexity and operation workload for hard decoding are remarkably lightened, the operation workload for erasure decoding is thus further lightened, and the capacity and throughput for erasure decoding in BEC are increased.

A detailed description of the system for LDPC code erasure decoding is hereinafter given based on the method for erasure decoding described above.

Figure 4:
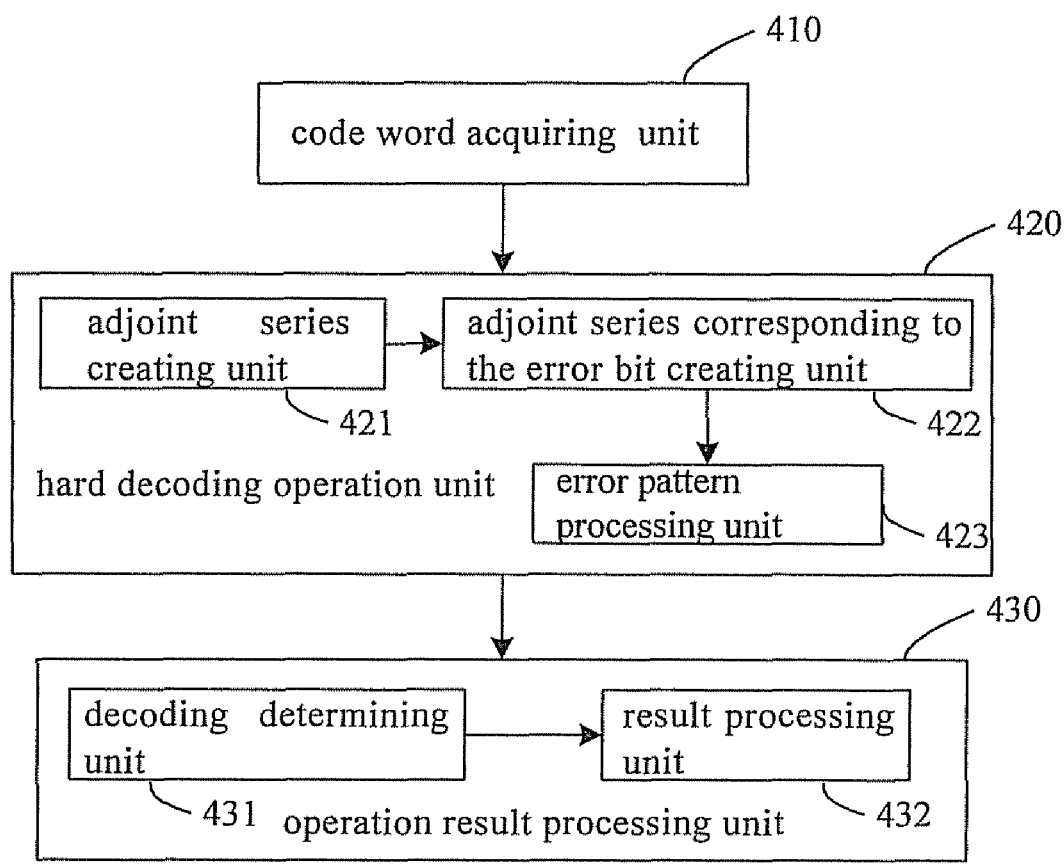
FIG. 4 is a schematic diagram illustrating the structure of a system for LDPC code erasure decoding in an embodiment of the present invention.

FIG. 4 is a schematic diagram illustrating the structure of a system for LDPC code erasure decoding in one embodiment of the present invention. As shown in FIG. 4, the system for LDPC code erasure decoding includes a code word acquiring unit 410, a hard decoding operation unit 420 and an operation result processing unit 430.

The code word acquiring unit 410 generates a first code word through setting a value as a value in GF(2) at each of erasure locations in a received code word and generates a second code word through setting the value as an inverse value of the value in GF(2) at each of the erasure locations in the received code word.

The hard decoding operation unit 420 conducts a hard decoding operation for the first code word to get a first result of hard decoding and conducts the hard decoding operation for the second code word to get a second result of hard decoding.

The operation result processing unit 430 determines a result of erasure decoding according to the first result of hard decoding and the second result of hard decoding.

The operation result processing unit 430 includes a decoding determining unit 431 and a result processing unit 432.

The decoding determining unit 431 determines the number of successful hard decoding operation in the result of hard decoding operations.

The result processing unit 432 for determines the result of erasure decoding according to the number of successful hard decoding operation.

The result processing unit 432 includes three subunits.

When the hard decoding operations for the first and second code words are successful, a subunit takes the result of the hard decoding operation with the smaller Hamming Weight of the two error patterns as the result of the erasure decoding.

When one of the hard decoding operations for the first and second code words is successful, a subunit takes the result of the hard decoding operation which is successful as the result of erasure decoding.

When the hard decoding operations for the first and second code words have failed, a subunit determines the erasure decoding has failed.

In this embodiment, the hard decoding operation is MLD operation. The hard decoding operation unit 420 includes an adjoint series creating unit 421, an adjoint series corresponding to the error bit creating unit 422 and an error pattern processing unit 423.

The adjoint series creating unit 421 multiplies the code word originally received by the LDPC code check matrix $H^T$ to get an adjoint series.

The adjoint series corresponding to the error bit creating unit 422 selects an adjoint series corresponding to each error bit of the error pattern from the adjoint series.

The error pattern processing unit 423 determines the value of the error bit according to each adjoint element in the adjoint series corresponding to the error bit.

It can be seen that the method and system for LDPC code erasure decoding provided in an embodiment of the present invention allow using the erasure decoding algorithm for LDPC codes constructed based on the finite field aimed at the BEC, increases the capability of system error correcting and thus also increases the capacity and throughput of the system.

The foregoing is only preferred embodiments of the present invention. The protection scope of this invention, however, is not limited to the above description. Any change or substitution, within the technical scope disclosed by this invention, easily occurring to those skilled in the art should be covered by the protection scope of this invention. Therefore, the protection scope of the present invention should be according to the claims.

The invention claimed is:

1. A method for Low Density Parity Check (LDPC) code erasure decoding, comprising:
    generating, by a LDPC code erasure decoding system, a first code word through setting a value as a value in Galois field having two elements GF(2) at each of erasure locations in a received LDPC code word;
    generating, by the LDPC code erasure decoding system, a second code word through setting the value as an inverse value of the value in GF(2) at each of the erasure locations in the received LDPC code word;
    conducting, by the LDPC code erasure decoding system, a Majority Logic Decoding, MLD, error correcting operation for the generated first code word to get a first result of hard decoding which includes a first error pattern;
    conducting, by the LDPC code erasure decoding system, the MLD error correcting operation for the generated second code word to get a second result of hard decoding which includes a second error pattern; and
    determining, by the LDPC code erasure decoding system, a result of erasure decoding according to the first result of hard decoding and the second result of hard decoding;
    wherein the conducting the MLD error correcting operation for the generated first and second code word comprises: multiplying the generated first or second code word by an LDPC code check matrix $H^T$ to get an adjoint series $\{s_1, s_2, \ldots s_J\}$;
    selecting, from the adjoint series $\{s_1, s_2, \ldots s_J\}$, an adjoint series corresponding to each error bit of the first error pattern or the second error pattern; and
    if the number of adjoint elements with a value of 1 in the selected adjoint series corresponding to an error bit is larger than half of the total number of adjoint elements in the selected adjoint series corresponding to the error bit, setting the value of the error bit as 1;
    otherwise, setting the value of the error bit as 0.

2. The method of claim 1, wherein the first result of hard decoding further comprises an identification (ID) indicating whether the MLD error correcting operation for the generated first code word is successful; and the second result of hard decoding further comprises an ID indicating whether the MLD error correcting operation for the generated second code word is successful.

3. The method of claim 2, wherein determining the result of erasure decoding according to the first result of hard decoding and the second result of hard decoding comprises:
    if the two MLD error correcting operations for the first and second code words are successful, taking the result of the MLD error correcting operation with the smaller Hamming Weight of the two error patterns as the result of the erasure decoding, and determining that the erasure decoding is successful;
    if one of the two MLD error correcting operations for the first and second code words is successful, taking the result of the successful MLD error correcting operation as the result of erasure decoding, and determining that the erasure decoding is successful;
    if the two MLD error correcting operations for the first and second code words have failed, determining that the erasure decoding has failed.

4. The method of claim 3, wherein taking the result of the two MLD error correcting operations with the smaller Hamming Weight of the two error patterns as the result of the erasure decoding comprises:
    taking the error pattern with a smaller minimum Hamming Weight as an erasure error pattern, and taking a modulo-2 sum of the erasure error pattern and the code word originally received as the result of erasure decoding.

5. The method of claim 3, wherein taking the result of one of the two MLD error correcting operations which is successful as the result of erasure decoding comprises:
    taking the error pattern corresponding to the successful MLD error correcting operation as the erasure error pattern, and taking a modulo-2 sum of the erasure error pattern and the code word originally received as the result of erasure decoding.

6. The method of claim 1, wherein selecting the adjoint series corresponding to each error bit of the first error pattern or the second error pattern comprises:
selecting the matrix element in the check matrix where the value of the matrix element is 1, and the column number of the matrix element is the same as the serial number of the error bit; and
selecting the element having the same location as the row number of the selected matrix element in the check matrix from the adjoint series $\{s_1, s_2, \ldots s_J\}$.

7. The method of claim 1, wherein the LDPC code comprises LDPC code used in the Binary Erasure Channel, BEC.

8. A system for Low Density Parity Check (LDPC) code erasure decoding, comprising:
a code word acquiring unit, for generating a first code word through setting a value as a value in Galois field having two elements GF(2) at each of erasure locations in a received LDPC code word; generating a second code word through setting the value as an inverse value of the value in GF(2) at each of the erasure locations in the received LDPC code word;
a hard decoding operation unit, for conducting a Majority Logic Decoding, MLD, error correcting operation for the generated first code word to get a first result of hard decoding which includes a first error pattern; conducting the hard decoding operation for the generated second code word to get a second result of hard decoding which includes a second error pattern; and
an operation result processing unit, for determining a result of erasure decoding according to the first result of hard decoding and the second result of hard decoding;
wherein the hard decoding operation unit comprises:
an adjoint series creating unit, for multiplying the generated first or second code word by an LDPC code check matrix $H^T$ to get an adjoint series $\{s_1, s_2, \ldots s_J\}$;
an adjoint series corresponding to the error bit creating unit, for selecting, from the adjoint series $\{s_1, s_2, \ldots s_J\}$, an adjoint series corresponding to each error bit of the first error pattern or the second error pattern; and
an error pattern processing unit, for setting the value of an error bit as 1 if the number of adjoint elements with a value of 1 in the selected adjoint series corresponding to the error bit is larger than half of the total number of adjoint elements in the selected adjoint series corresponding to the error bit; and for setting the value of an error bit as 0 if the number of adjoint elements with a value of 1 in the selected adjoint series corresponding to the error bit is not larger than half of the total number of adjoint elements in the selected adjoint series corresponding to the error bit.

9. The system of claim 8, wherein the operation result processing unit comprises:
a decoding determining unit, for determining the number of successful MLD error correcting operation in the result of hard decoding; and
a result processing unit, for determining the result of erasure decoding according to the number of successful MLD error correcting operation.

10. The system of claim 9, wherein the result processing unit comprises:
a subunit for taking the result of the MLD error correcting operation with the smaller Hamming Weight of the two error patterns as the result of the erasure decoding when the MLD error correcting operations for the first and second code words are successful;
a subunit for taking the result of the MLD error correcting operation which is successful as the result of erasure decoding when one of the MLD error correcting operations for the first and second code words is successful; and
a subunit for determining the erasure decoding has failed when the MLD error correcting operations for the first and second code words have failed.

11. A system for Low Density Parity Check (LDPC) code erasure decoding, comprising one or more components configured for:
generating a first code word through setting a value as a value in Galois field having two elements GF(2) at each of erasure locations in a received LDPC code word;
generating a second code word through setting the value as an inverse value of the value in GF(2) at each of the erasure locations in the received LDPC code word;
conducting a Majority Logic Decoding, MLD, error correcting operation for the generated first code word to get a first result of hard decoding which includes a first error pattern;
conducting the MLD error correcting operation for the generated second code word to get a second result of hard decoding which includes a second error pattern; and
determining a result of erasure decoding according to the first result of hard decoding and the second result of hard decoding;
wherein the conducting the MLD error correcting operation for the generated first and second code word comprises: multiplying the generated first or second code word by an LDPC code check matrix $H^T$ to get an adjoint series $\{s_1, s_2, \ldots s_J\}$;
selecting, from the adjoint series $\{s_1, s_2, \ldots s_J\}$, an adjoint series corresponding to each error bit of the first error pattern or the second error pattern; and
if the number of adjoint elements with a value of 1 in the selected adjoint series corresponding to an error bit is larger than half of the total number of adjoint elements in the selected adjoint series corresponding to the error bit, setting the value of the error bit as 1;
otherwise, setting the value of the error bit as 0.

12. The system of claim 11, wherein the system is further configured for:
determining the number of successful MLD error correcting operation in the result of hard decoding; and
determining the result of erasure decoding according to the number of successful MLD error correcting operation.

13. The system of claim 12, wherein the system is further configured for:
taking the result of the MLD error correcting operation with the smaller Hamming Weight of the two error patterns as the result of the erasure decoding when the MLD error correcting operations for the first and second code words are successful;
taking the result of the MLD error correcting operations which is successful as the result of erasure decoding when one of the MLD error correcting operations for the first and second code words is successful; or
determining the erasure decoding has failed when the MLD error correcting operations for the first and second code words have failed.

14. A machine-readable storage medium that provides instructions for Low Density Parity Check (LDPC) code erasure decoding, wherein, when executed by a processor, the machine-readable storage medium causes the processor to perform operations comprising:

generating a first code word through setting a value as a value in Galois field having two elements GF(2) at each of erasure locations in a received LDPC code word;

generating a second code word through setting the value as an inverse value of the value in GF(2) at each of the erasure locations in the received LDPC code word;

conducting a Majority Logic Decoding, MLD, error correcting operation for the generated first code word to get a first result of hard decoding which includes a first error pattern;

conducting the MLD error correcting operations for the generated second code word to get a second result of hard decoding which includes a second error pattern; and determining a result of erasure decoding according to the first result of hard decoding and the second result of hard decoding;

wherein the conducting the MLD error correcting operation for the generated first and second code word comprises: multiplying the generated first or second code word by an LDPC code check matrix $H^T$ to get an adjoint series $\{s_1, s_2, \ldots s_J\}$;

selecting, from the adjoint series $\{s_1, s_2, \ldots s_J\}$, an adjoint series corresponding to each error bit of the first error pattern or the second error pattern; and if the number of adjoint elements with a value of 1 in the selected adjoint series corresponding to an error bit is larger than half of the total number of adjoint elements in the selected adjoint series corresponding to the error bit, setting the value of the error bit as 1; otherwise, setting the value of the error bit as 0.

15. The machine-readable storage medium of claim 14, wherein the first result of hard decoding further comprises an identification (ID) indicating whether the hard decoding operation for the generated first code word is successful; and the second result of hard decoding further comprises an ID indicating whether the hard decoding operation for the generated second code word is successful.

16. The machine-readable storage medium of claim 14, wherein determining the result of erasure decoding according to the first result of hard decoding and the second result of hard decoding comprises:

if the two MLD error correcting operations for the first and second code words are successful, taking the result of the MLD error correcting operations with the smaller Hamming Weight of the two error patterns as the result of the erasure decoding, and determining that the erasure decoding is successful;

if one of the two MLD error correcting operations for the first and second code words is successful, taking the result of the successful MLD error correcting operations as the result of erasure decoding, and determining that the erasure decoding is successful;

if the two MLD error correcting operations for the first and second code words have failed, determining that the erasure decoding has failed.

\* \* \* \* \*